(12) United States Patent
Fujiu

(10) Patent No.: US 9,007,826 B2
(45) Date of Patent: Apr. 14, 2015

(54) NON-VOLATILE SEMICONDUCTOR MEMORY DEVICE

(75) Inventor: Masaki Fujiu, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 237 days.

(21) Appl. No.: 13/607,699

(22) Filed: Sep. 8, 2012

(65) Prior Publication Data

US 2013/0235662 A1 Sep. 12, 2013

(30) Foreign Application Priority Data

Mar. 12, 2012 (JP) ................. P2012-054216

(51) Int. Cl.
*G11C 11/34* (2006.01)
*G11C 16/34* (2006.01)
*G11C 11/56* (2006.01)
*G11C 16/04* (2006.01)

(52) U.S. Cl.
CPC ........ *G11C 16/3459* (2013.01); *G11C 11/5628* (2013.01); *G11C 16/0483* (2013.01)

(58) Field of Classification Search
CPC ........... G11C 11/5628; G11C 11/5642; G11C 11/5621; G11C 16/0483; G11C 2211/5621
USPC ........... 365/185.03, 185.24, 185.22, 285.5, 365/238.5
See application file for complete search history.

(56) References Cited

U.S. PATENT DOCUMENTS

| 6,925,004 B2 * | 8/2005 | Shibata et al. ........... 365/185.03 |
| 8,472,280 B2 * | 6/2013 | Li ............................... 365/238.5 |
| 2007/0064482 A1 | 3/2007 | Takeuchi |
| 2008/0313387 A1 | 12/2008 | Shibata |
| 2009/0290426 A1 * | 11/2009 | Moschiano et al. ..... 365/185.22 |

FOREIGN PATENT DOCUMENTS

| JP | 2007-070501 | 3/2007 |
| JP | 2010-027165 | 2/2010 |

* cited by examiner

*Primary Examiner* — Douglas King
*Assistant Examiner* — Ajay Ojha
(74) *Attorney, Agent, or Firm* — Patterson & Sheridan, LLP

(57) ABSTRACT

In one embodiment, a control circuit executes a first page writing operation, a first verify operations, a second page writing operation, a second verify operations, a step-up operation. The control circuit executes the first page writing operation which forms an intermediate distribution, and a first read operation which reads data form the intermediate distribution by using a determine voltage higher than a first verify voltage with a first value, and changes a second verify voltage based on the result of the first read operation.

9 Claims, 16 Drawing Sheets

Lower Page PRG

Upper Page PRG

Fig. 11
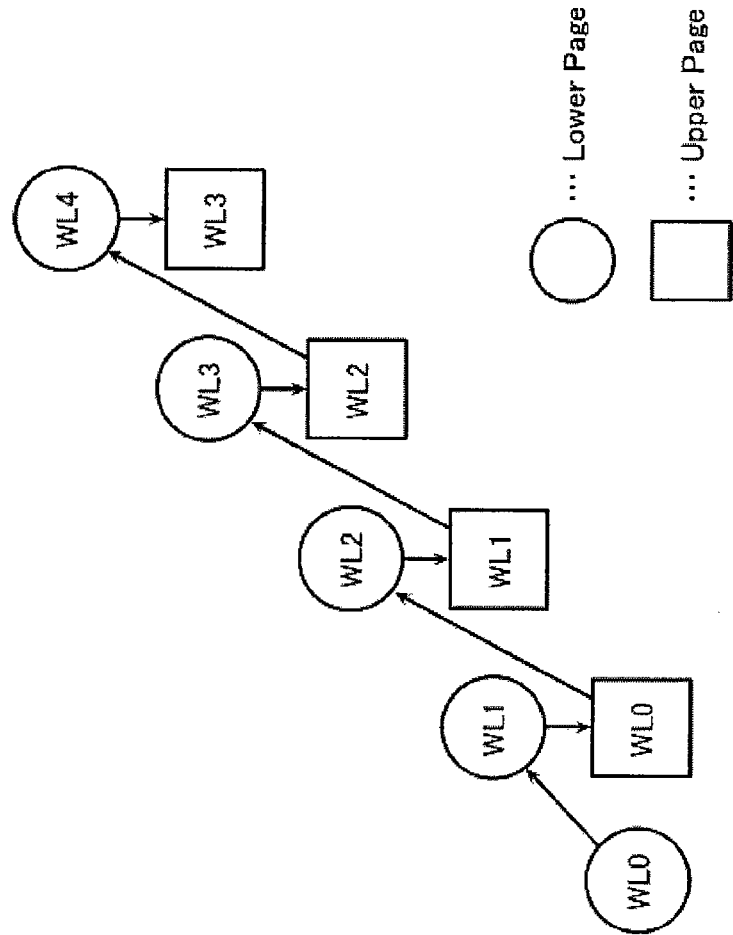
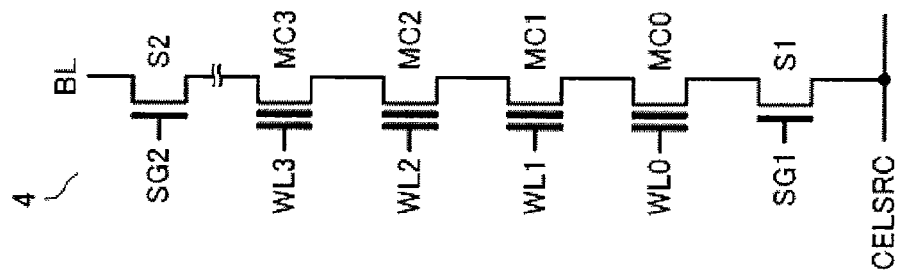

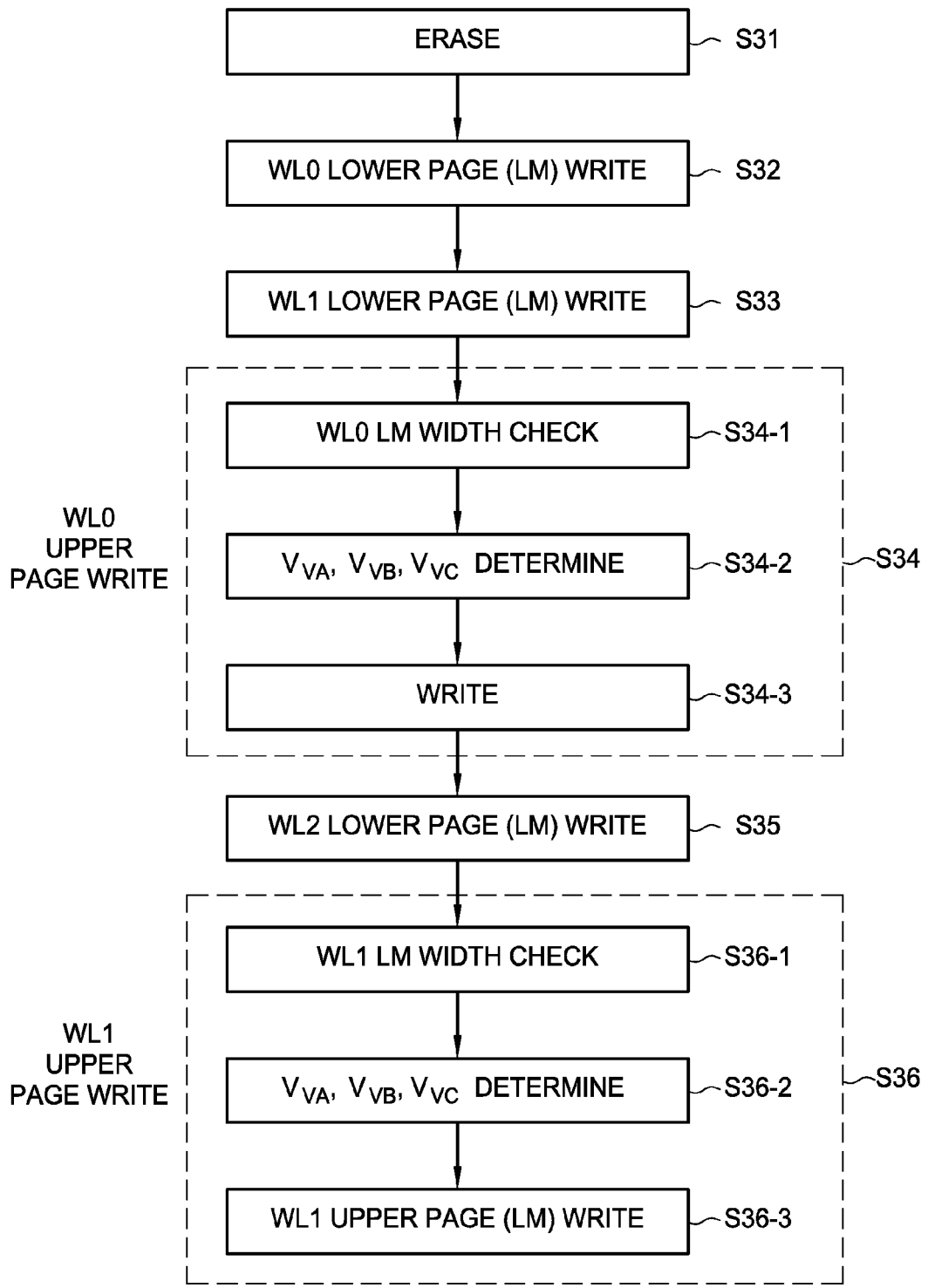

dC = dB = dA

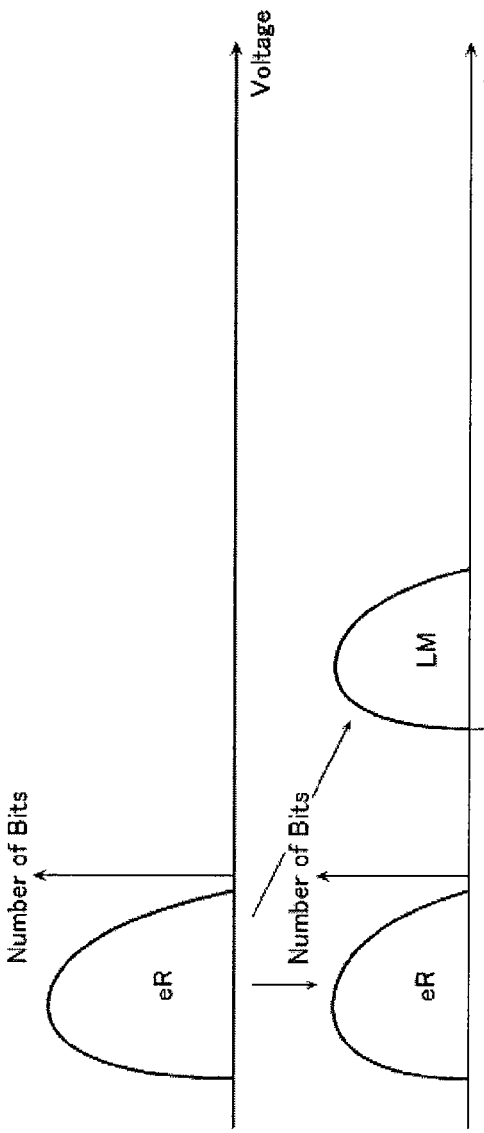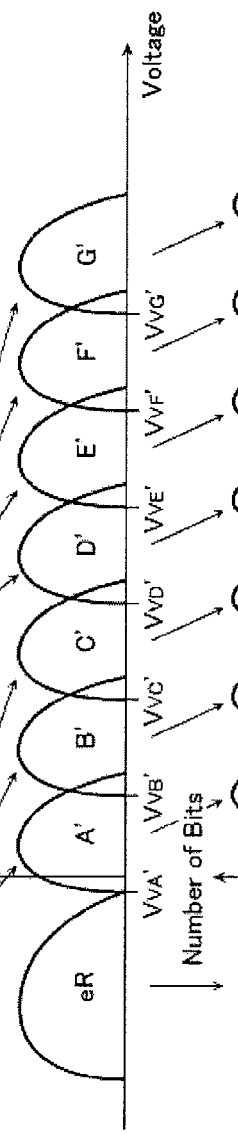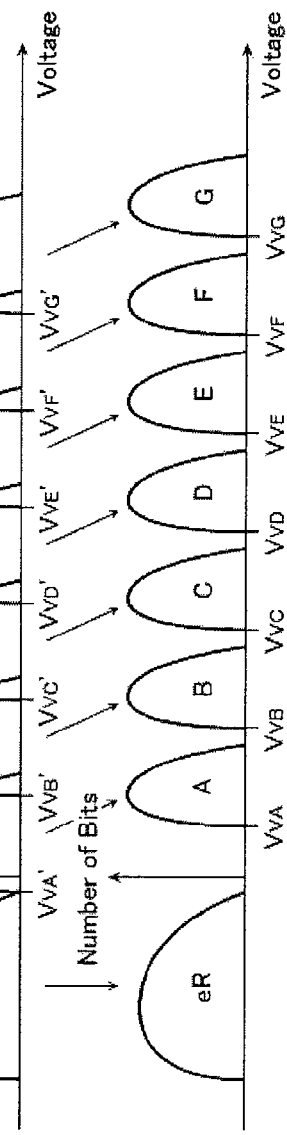

NON-VOLATILE SEMICONDUCTOR MEMORY DEVICE

CROSS-REFERENCE TO RELATED APPLICATION

This application is based upon and claims the benefit of priority from Japanese Patent Application No. 2012-054216, filed Mar. 12, 2012; the entire contents of which are incorporated herein by reference.

FIELD

Embodiments described herein relate to a non-volatile semiconductor memory device.

BACKGROUND

Conventional flash memory with a memory cell that stores charge in a charge storage layer as is used widely. This is because this type of memory has a cost per bit is low, there is a high level of integration, and the memory is non-volatile. For example, NAND-type flash memory can be highly integrated, as the connections between memory cells can be reduced by connecting memory cells in series between selected transistors.

Relatively recently, multi-value storage systems that can store more than 2 bits of data in a single memory cell have emerged in competition with conventional systems, which store only 2 bits per memory cell. These devices have increased capacity and, generally, are cheaper to manufacture and smaller in size.

In a data write operation (program operation) of NAND-type flash memory, a verify read operation is performed to determine if the target threshold voltage has been met. If the number of cells which have not met the target threshold voltage (verify read voltage) level is greater than a predetermined number, the write voltage is increased (this is called a step-up operation). Subsequent verify read operations are repeated until the target threshold voltage is finally obtained.

It is well known that if the write operation and the erase operation in the NAND-type flash memory are repeated many times there will be a gradual deterioration of the gate-insulating film of the memory cell, which may reduce the data retention characteristics of the memory cell. As data retention characteristics deteriorate, there will be an increase in the probability of a data misread.

In addition, it would be preferable to shorten the write time of NAND-type flash memory devices to improve their performance.

DESCRIPTION OF THE DRAWINGS

FIG. 11 shows a conceptual diagram for the explanation of the write operation of NAND-type flash memory of the first embodiment.
FIG. 12 shows a flow chart for the explanation of the write operation of NAND-type flash memory of the first embodiment.
FIGS. 15A to 15D show potential variations for operation of NAND-type flash memory for storing more than 2 bits in a memory cell.

DETAILED DESCRIPTION

A non-volatile semiconductor memory device that can shorten data write times while suppressing the number of erroneous data reads is presented as an embodiment of the present invention.

A non-volatile semiconductor memory device comprises a memory cell array; a memory string includes a plurality of memory cells connected in series, which store multi-valued data; a word line that connects to one of the a plurality memory cells; a bit line that is connected to a first end of the memory string; a source line connected to a second end of the memory string; a sense amplifier circuit to determine the data to be stored in the memory cell by detecting the potential or the electric current of the bit lines; a control circuit executes a first page writing operation to form an intermediate distribution by changing a threshold voltage of the memory cells connected to the word line, a first verify operations to determine if the first page writing operation to the memory cell has been completed by using a first verify voltage, a second page writing operation to change the intermediate distribution, a second verify operations to determine if the second page writing operation to the memory cell has been completed by using a second verify voltage and a step-up operation that increases the program voltage by a step-up voltage amount based on results of the verify reading. The control circuit executes the first page writing operation which forms an intermediate distribution, and a first read operation which reads data form the intermediate distribution by using a determine voltage higher than the first verify voltage with a first value, and changes the second verify voltage based on the result of the first read operation Embodiment 1

Figure 1:
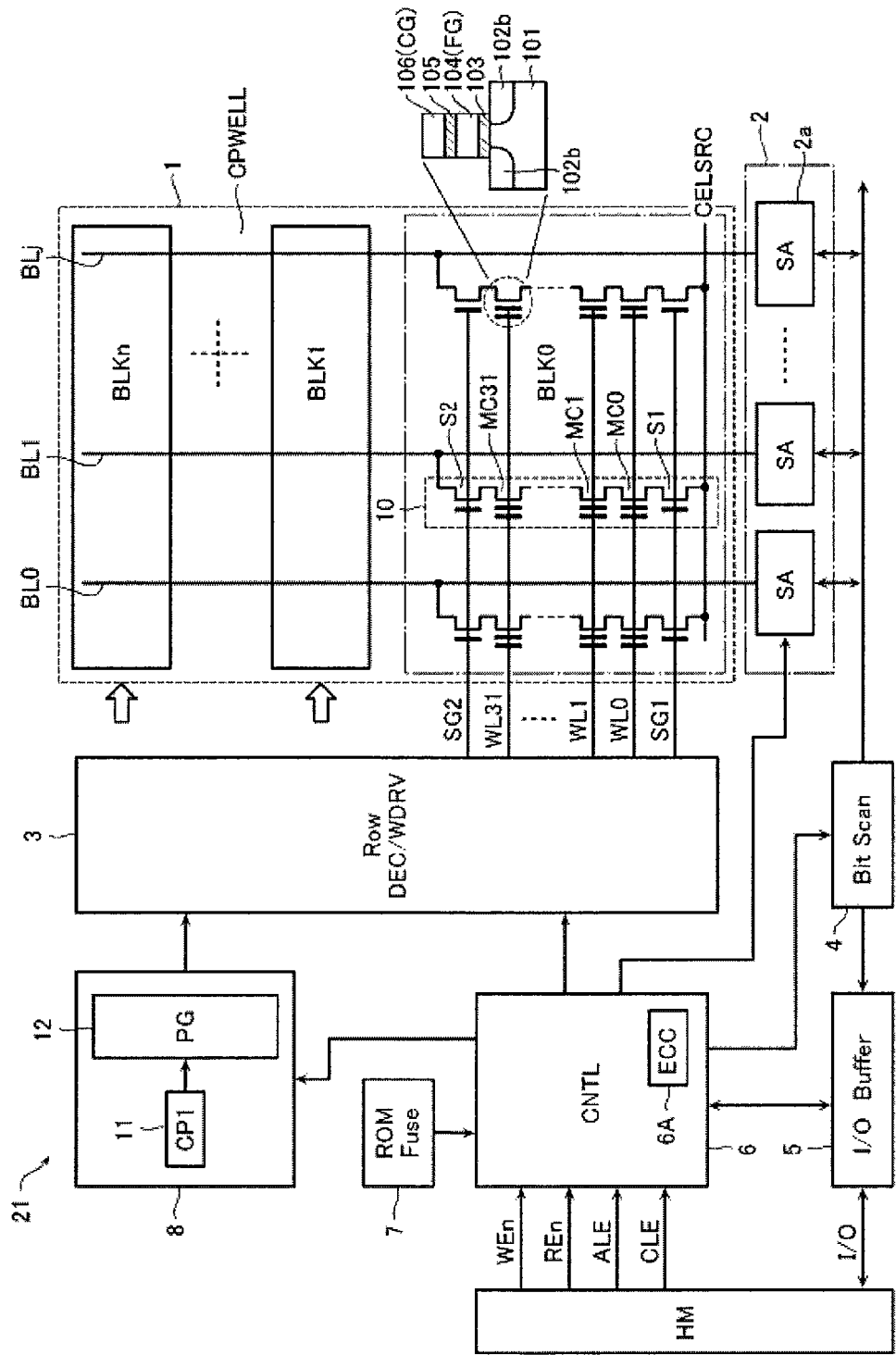
FIG. 1 shows a schematic diagram of NAND-type flash memory according to a first embodiment.

FIG. 1 shows the schematic configuration of NAND-type flash memory 21, based on the first embodiment. As shown in FIG. 1, NAND-type flash memory 21 is configured from memory cell array 1, sense amplifier circuit 2, row decoder 3, bit scan circuit 4, input and output buffers 5, control circuit 6, ROM fuse 7, and voltage generation circuit 8. The control circuit 6 is configured with the control unit for memory cell array 1.

Memory cell array 1 is configured from a matrix array of NAND cell unit 10. A single NAND cell unit 10 is configured from a memory string is formed by memory cells connected in series MC (MC0, MC1, . . . , MC31) and selection gate transistors S1 and S2 are connected (by the drain of S1 on one end and source of S2 on the other) to the ends of the memory string.

A single memory cell (MC) includes a gate-insulating film 103 (tunnel insulating film) formed on the surface of well 101 between drain 102a and source 102b. Floating gate electrode 104 is formed as a charge accumulation layer on gate-insulating film 103. A control gate electrode 106 formed on insulating film 105, which is above floating electrode 104. The control gate is connected to a single word line. The source of select gate transistor S1 is connected to common source line CELSRC, and the drain of select gate transistor S2 is connected to bit line BL. Floating gate electrode 104 may be formed as a silicon layer or an insulating layer with charge trap or laminated these layers.

The control gates of each of the memory cells MC (MC0, MC1, . . . MC31) of NAND cell unit 10 are connected to a different word lines WL (WL0, WL1, . . . , WL31), respectively. The gates of select gate transistors S1, S2 are connected to select gate lines SG1, SG2, respectively. An assembly of memory cells sharing the same word line constitutes one page (or plural pages depending upon the number of bits stored in one memory cell). An assembly of NAND cell units 10 sharing word lines WL and select gate lines SG1, SG2 constitutes a block BLK that acts as the data erasing unit.

As shown in the FIG. 1, memory cell array 1 is composed of multiple blocks BLK (BLK0, BLK1, . . . , BLKn) with the blocks arrayed in the direction of the bit lines BL. Memory cell array 1 (and its component blocks BLK) is formed within a single cell well (CPWELL) on semiconductor substrate.

Sense amplifier circuit 2 is connected to bit lines BL of memory cell array 1. Sense amplifier circuit 2 determines the data to be stored in the memory cell by detecting the potential or the current of the bit lines BL. Sense amplifier circuit 2 has a page buffer for storing write data, multiple sense amplifiers SA, and a column select gate. Row decoder 3 (including the word line driver) selects and drives the word lines WL and select gate lines SG1, SG2.

Bit scan circuit 4 counts the verify pass bit number (write operation completed (PASS), in other words, the number of memory cells reached the target threshold voltage distribution), based on the read data that is stored in sense amplifier circuit 2 after the verify read operation.

Control circuit 6 determines whether writing operations for memory cells connected to one of word lines WL are completed consistent with the results of bit scan circuit 4. If the number of memory cells with write failure is less than the specified number, the write operation terminate method (pseudo-pass method) can be used instead of repeated write operations, until the writing to all memory cells along a single word line WL is completed. In addition, control circuit 6 changes the value of the verify read voltage based on the result from bit scanning circuit 4.

[Configuration of Sense Amplifier Circuit 3]

Figure 2:
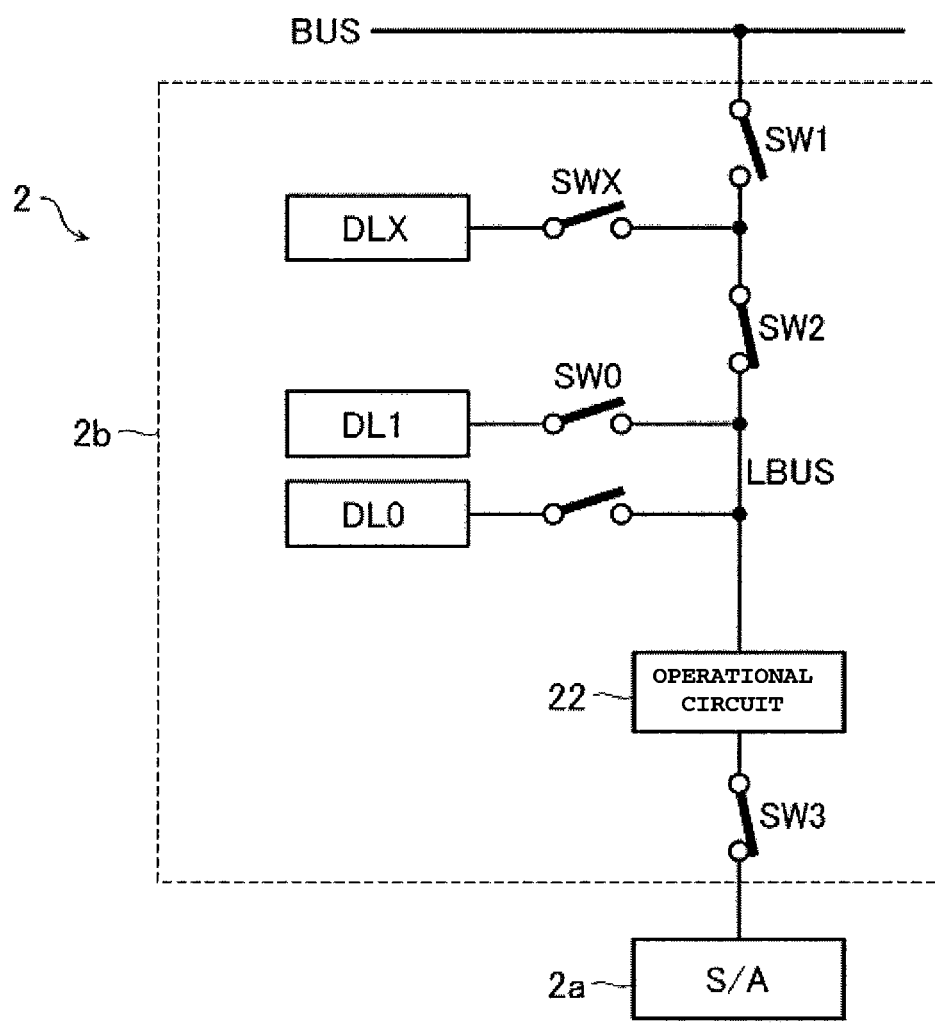
FIG. 2 shows a circuit diagram of an example configuration of the sense amplifier circuit in FIG. 1.

Next, an example sense amplifier circuit 2 is explained with reference to FIG. 2. The depicted sense amplifier circuit 2 has a configuration that is suited for executing a method that stores 2 bits per memory cell (2 bits/cell). The sense amplifier circuit 2 has a sense amplifier 2a and a data register 2b.

Data register 2b is configured with operation circuit 22, which executes a logical operation for a data read from sense amplifier 2a and for the three data latches DL0, DL1, and DLX, which temporarily keep the output data from operation circuit 22. The data latches may sometimes be collectively called "data latch DL." Data latches DL0 and DL1 are connected to local bus LBUS through respective switch SW0.

In addition, data register 2b has switch SW1 which can open and close the connection between data register 2b and the data bus BUS. Switch SW2 controls the connection between the local bus LBUS and data latch DLX. Switch SW3 opens and closes the connection between sense amplifier 2a and operation circuit 22. The operation of switch SW1 and switch SW2 can be controlled in a complimentary manner such that when one is closed, the other is open. Switch SWX closes simultaneously with one of the switches SW1 or SW2 and connects data latch DLX to either local bus LBUS or data bus BUS. Transistors may be used in the switch SWX.

The operational circuit 22 performs logical operations with data read by sense amplifier 2a and data stored in the data latches DL. It also transfers operation results to the data latches DL.

The data register 2b of this embodiment stores the read data in data latch DLX by turning switch SW2 off (opening the switch) and switch SW1 on (closing the switch). Data latch DLX can exchange data externally through the data bus BUS by opening switch SW2 and closing switch SW1. It is also possible to execute a read operation using sense amplifier 2a and data latches DL0-DL1 simultaneously, which will be described later.

Figure 3:
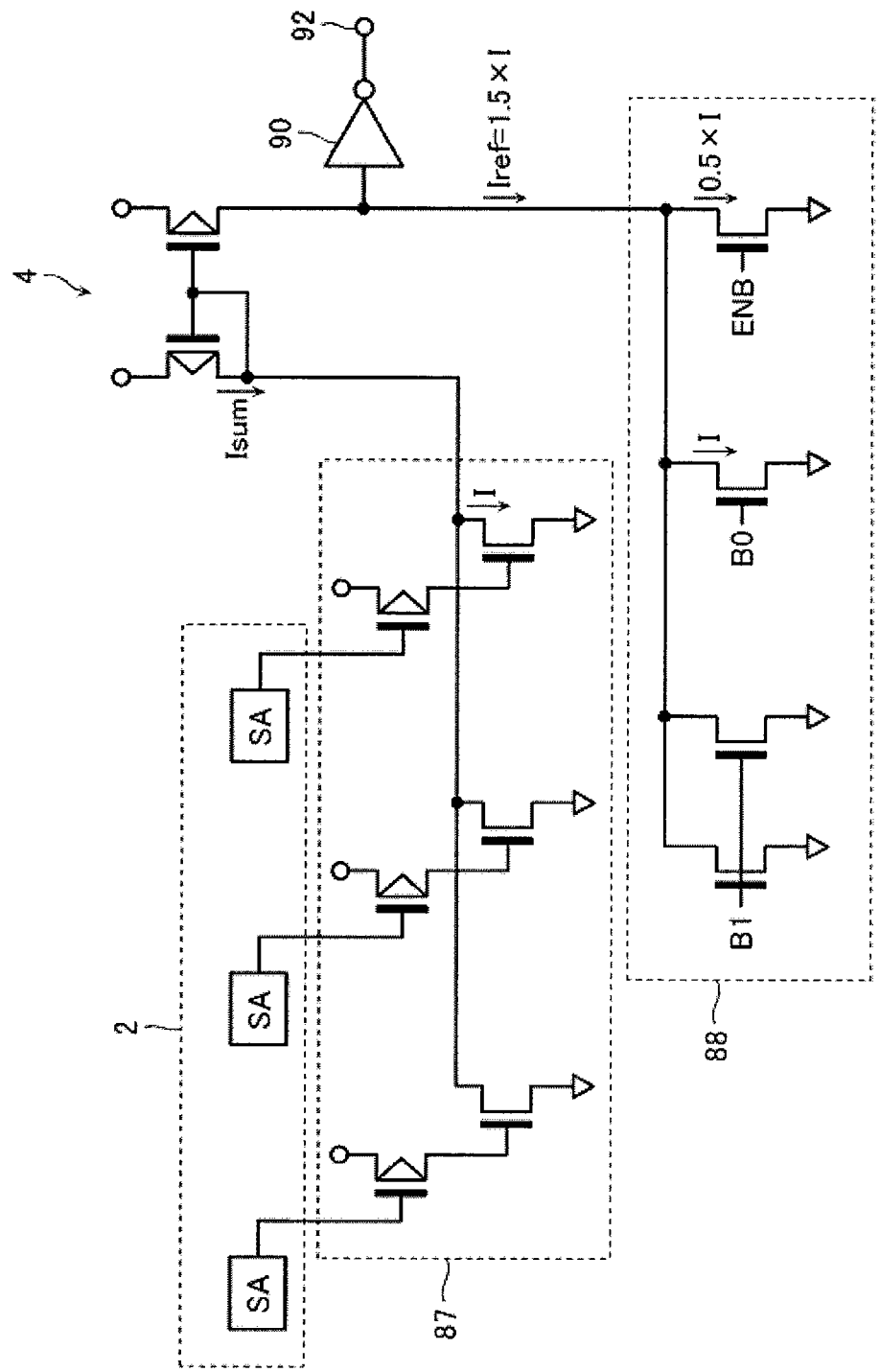
FIG. 3 shows a circuit diagram of an example configuration of the bit scan circuit in FIG. 1.

FIG. 3 shows an example of the circuit configuration of bit scan circuit 4. The bit scan circuit 4 is provided with a sense current pass 87, reference fixed-current pass 88, inverter 90, and output node 92. The sense amplifier circuit 2 a single page stores the read results, pass/fail data, of verify read operation for that page. In this case, when the verify read result is "PASS," an "H" level is stored; and when the result is "FAIL," an "L" level is stored.

The bit scan circuit 4 with this configuration detects the differential current between the current, Isum, flowing through sense current pass 87 and the reference current, Iref, flowing through the reference fixed-current pass at output node 92 of inverter 90. The signals B0 and B1 supplied to the gate terminal of a MOS transistor within reference constant current pass 88 are the signals that are set based on the reference value and the number of verify pass bits detected.

Referring again to FIG. 1, data I/O buffer 5 receives command data and address data as well as performing data transfer between the sense amplifier circuit 2, the bit scan circuit 4, and external I/O terminal.

Control circuit 6 receives external control signals, such as write-enable signal WEn, read-enable signal REn, address latch-enable signal ALE, command latch-enable signal CLE, from the HM external device (host and memory controller) and controls the overall memory operation.

Control circuit 6 includes a command interface, address latch circuit, and transfer circuit, and determines whether the supplied data is write data or address data. Write data is transferred to sense amplifier circuit 2 and address data is transferred to row decoder 3 and sense amplifier circuit 2. In addition, control circuit 6 performs sequence control of read, write, and erase. Control circuit 6 also controls the applied voltage based on the external control signal.

The voltage generation circuit 8 is provided with a booster circuit 11 and pulse generation circuit 12.

Figure 4A:
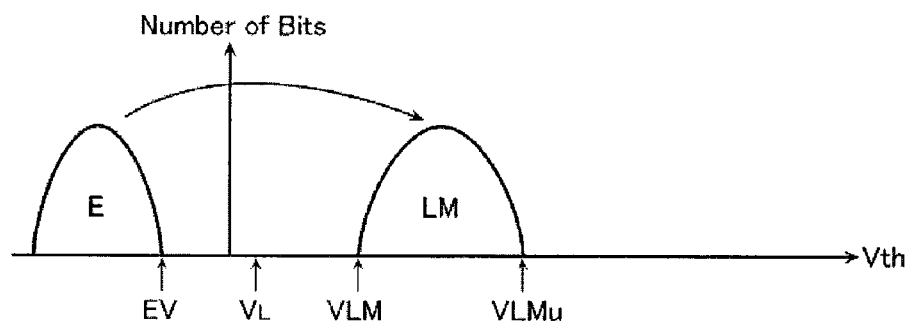
FIGS. 4A and 4B show conceptual diagrams for the procedure of a write operation when storing 2 bits of data in a single memory cell.
Figure 4B:
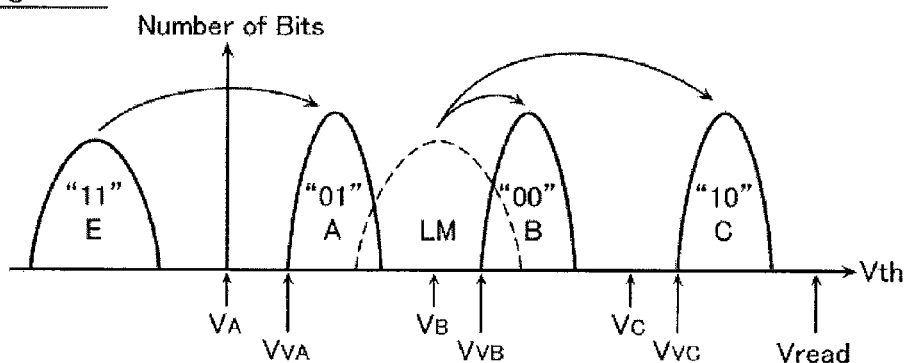

In FIGS. 4A and 4B, an example of the write method for executing a four-value data storage method (2 bits/cell) for the NAND-type flash memory used in this embodiment is shown. Four-value data is regulated, for instance, by the negative threshold voltage distribution (erasure distribution) E, which is at the lowest voltage level, and the threshold voltage distribution A, B, C, which is at a higher voltage level than the distribution E. In order to write this four-value data, all the memory cells in the selected block are first set to the lowest negative threshold voltage distribution E by the execution of the data erase operation. This data erase operation is performed by applying the erase voltage, Vera, from the well driver (not shown) to the well in which memory cell array 1 is formed and by reducing the voltage of the entire word line (or part of it) to a voltage that is less Vera and releasing the electrons of the floating gates of the entire memory cell MC (or part of it).

Next comes a lower page write (Lower Page Program), which writes till the intermediate distribution LM state is obtained by the selected cells. The lower page write may sometimes be referred to as the first page write. If the lower page data bit to be written is "1," the memory cell will be left in the negative threshold voltage distribution E state. On the other hand, when the lower page data to be written is "0," a write operation is carried out to apply the intermediate distribution LM to that memory cell. In this case, the verify read voltage will be set to voltage VLM and a verify read operation is performed to confirm the completion of the write operation to the intermediate distribution. Voltage VLM is the voltage applied to the control gate of the select memory cell M.

After the lower page write, the upper page write (Upper Page Program) is performed. The upper page write increases the threshold voltage distribution from the intermediate distribution LM to threshold voltage distribution B or C. The upper page write also increases the threshold voltage distribution from E to A. The upper page write may sometimes be referred to as the second page write. If the data of upper page write is "1", the threshold voltage distribution after the upper page write will be varied according to the lower page data. When the lower page data is "1", the cell state will be left unchanged (with distribution E) when the upper page data is also "1". When the lower page data is "1" and the upper page data is "0", the cell state will be changed to threshold voltage distribution A (from distribution E) by the upper page write. When the lower page data is "0" and the upper page data is the cell state is changed from intermediate distribution LM to distribution B. When the lower page data is "0" and the upper page data is "1" the cell state is changed to distribution C from intermediate distribution LM. A verify read operation may then be carried out using voltage $V_{VA}$, $V_{VB}$, or $V_{VC}$ as the verify read voltage. At the data read operation after the write operation, a read voltage applied between the control gate source of selected memory cell M is set to read voltages VA, VB, or VC, which are between the upper and lower limits of each threshold voltage distributions E through C (as depicted in FIG. 4B). A high read voltage (read pass voltage), Vread, is applied to the non-selected memory cell. The read pass voltage Vread is a voltage with a value above the upper limit of the threshold voltage distribution C. The value of Vread exceeds the upper limit of voltage distribution C by a margin. A memory cell applied the read pass voltage Vread is switched to a conducting state regardless of the stored data in memory cell.

The above write data is performed by applying the following voltages to each part. Program voltage Vpgm (for example, about 18V or more) is applied to the select word line connected to the select memory cell to be written. Write pass voltage Vpass (for example, about 10V or more) is applied to a non-selected word line connected to the non-selected memory cell. Bit line BL is supplied with ground voltage Vss when write data is "0", which increases the threshold voltage, or supply voltage Vdd when the write data is "1", which does not increase the threshold voltage.

In other words, when the write data is "0", ground voltage Vss supplied to the bit line BL which is then transferred to a channel of the NAND cell unit, and charge is injected to the charge storage layer from the channel when program voltage Vpgm is supplied. On the other hand, if write is (inhibited-write), the NAND cell channel is charged until reaching supply voltage Vdd and becomes floating, the cell channel is boosted by capacitance coupling, and charge injection does not occur when program voltage Vpgm is applied.

Figure 5:
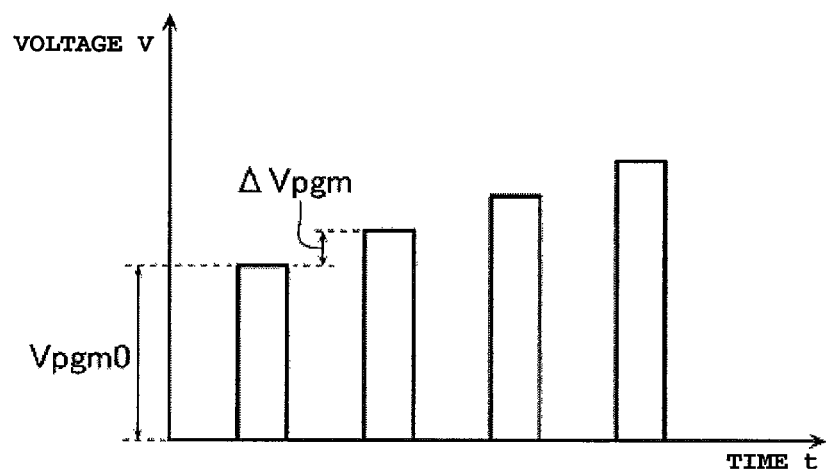
FIG. 5 shows a conceptual diagram for the explanation of the write operation of NAND-type flash memory of the first embodiment.

For the data write, as shown in FIG. 5, a step-up write method that increases the program voltage by only a step-up voltage amount (Δ Vpgm) for each subsequent write cycle (write operation and verify read operation) is used.

Check write status (a verify read operation) is performed to bring the lower limit of the threshold voltage of the intermediate distribution LM above a voltage using a lower page write (a write of the intermediate distribution LM). In other words, a verify read operation is performed that applies verify read voltage VLM between the control gate of the selected memory cell (selected word line) and source. If the selected memory cell is conducting state after the verify read voltage is applied, then the write has been unsuccessful (FAIL). If the selected memory cell is not conducting state, then write has been successful (PASS). In subsequent write operations, supply voltage Vdd is supplied to the bit line of memory cell which have been successfully written to inhibit memory cell writing. For those cells failing the verify read operation, ground voltage Vss is supplied to the bit line and "0" write is performed.

Similarly, a verify read operation of threshold voltage distribution A, B, and C is performed using verify read voltages $V_{VA}$, $V_{VB}$, and $V_{VC}$, respectively, during an upper page write.

If the write and erase operations are executed too many times, there will be a deterioration of the gate-insulating film in the memory cell data retention characteristics are reduced. This phenomenon has become much more serious as the shrinking of memory cells has continued.

It is effective for the deterioration characteristics of memory cells to set the difference between the read voltage VA, VB, VC and the verify read voltages $V_{VA}$, $V_{VB}$, and $V_{VC}$ ($V_{VA}$–VA, $V_{VB}$–VB, $V_{VC}$–VC) to be large to have a margin of. However, as read voltages are increased, the speed of the write operation is reduced and the performance of NAND-type flash memory is lowered.

To improve the data retention characteristics of NAND-type flash memory without slowing the write speed, the distribution width of the intermediate distribution LM written by a lower page write may be measured at the time of an upper page write. The value of verify read voltages $V_{VA}$, $V_{VB}$, and $V_{VC}$ may be changed accordingly based on the distribution width of the intermediate distribution LM. The verify read voltages are then used in an upper page write.

Specifically, the distribution width of the intermediate distribution LM is directly proportional to the value of the verify read voltages $V_{VA}$, $V_{VB}$, and $V_{VC}$ (that is, the wider the distribution width, the larger the magnitude of voltage).

When width of the intermediate distribution LM is large, the degradation of the tunnel insulating film of the memory cell will occur and the data retention characteristics will be reduced. In other words, the number of traps of the tunnel insulating film becomes increasing if defects of the tunnel insulating film occurs, and it becomes easier for the electrons to be injected by the FN tunnel current, as a result an overwrite occurs. On the other hand, when a defect occurs at the tunnel insulating film, the charge temporarily trapped in the charge storage layer escapes to the channel side and the threshold voltage of memory cell may get reduced as a result. In other words, between the upper and lower limits of the threshold voltage distribution is broad, causing the distribution width to increase. As a result, the distribution width of intermediate distribution LM will be large.

The wider intermediate distribution LM, the greater the possibility of a read error in a memory cell whose threshold voltage has been reduced due to the deterioration of data retention characteristics. The possibility of a read error can be reduced by increasing the magnitude of the verify read voltages $V_{VA}$, $V_{VB}$, and $V_{VC}$.

On the other hand, in the case where the width of intermediate distribution LM is small, the difference between the read voltages VA, VB, and VC can be reduced by reducing the verify read voltages $V_{VA}$, $V_{VB}$, and $V_{VC}$, and as a result the write speed can be improved. By measuring the width of intermediate distribution LM, it is possible to balance dealing with the deterioration of data retention characteristics and improving write speed.

Figure 6A:
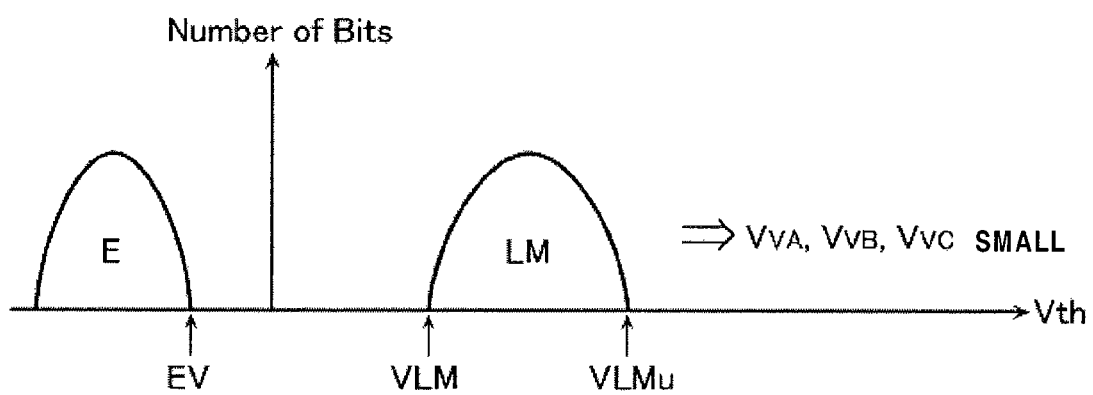
FIG. 6A shows a conceptual diagram for the explanation of the write operation of NAND-type flash memory of the first embodiment.
Figure 6B:
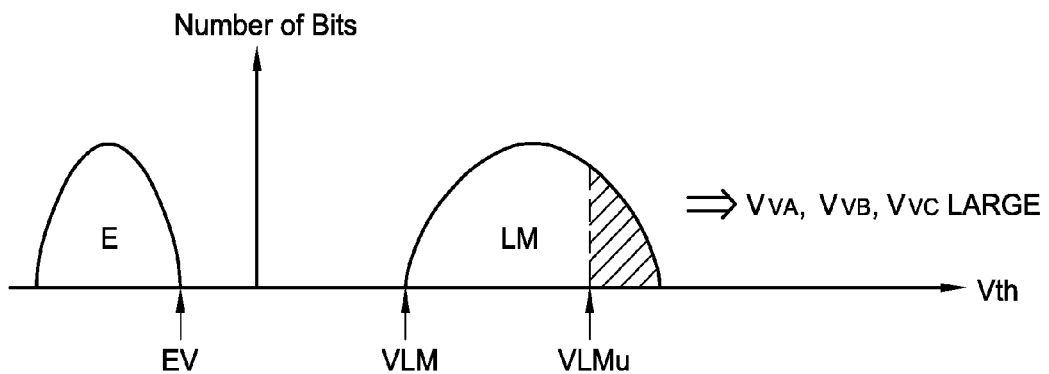
FIG. 6B shows a conceptual diagram for the explanation of the write operation of NAND-type flash memory of the first embodiment.

The determination of the distribution width of an intermediate distribution LM is executed, for instance, as shown in the FIG. 6A and FIG. 6B. After a lower page write operation a read is carried out using a read voltage VLMu that is greater than the verify read voltage VLM by a voltage (for example, 1.5 V) in an upper page write. If the distribution width of the intermediate distribution LM is narrow, as shown in FIG. 6A, a significant part of the intermediate distribution LM is distributed towards a voltage that is lower than this read voltage VLMu. Therefore, most of the memory cells output data that is "1" and the number of memory cells that output data "0" decreases when the read operation is performed with this read voltage VLMu.

On the other hand, when the distribution width of the intermediate distribution LM is wide, as shown in the FIG. 6B, a significant part of the intermediate distribution LM is distributed towards a voltage that is higher than the read voltage VLMu. If the read operation is carried out using this read voltage VLMu, the number of memory cells that output data "0" will increase compared to FIG. 6A. In other words, the distribution width of the intermediate distribution LM can be determined by comparing the number of memory cells that output data "0" when the read operation using read voltage VLMu is carried out. The number of memory cells that output data "0" can be counted using the bit scan circuit 4. Also, the read voltage VLMu can be fixed or variable. It is possible to change the switching criteria of the verify read voltages $V_{VA}$, $V_{VB}$, and $V_{VC}$ by setting the read voltage VLMu as a variable.

Figure 7:
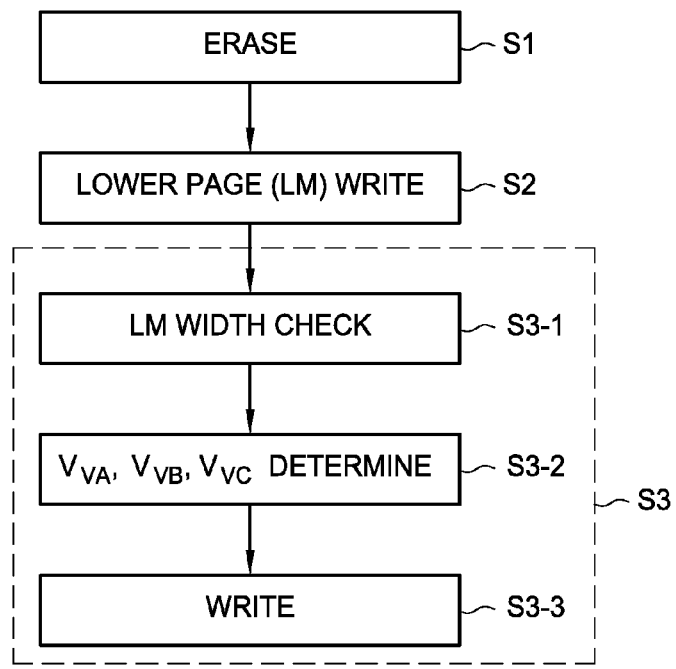
FIG. 7 shows a flowchart for the explanation of the write operation of NAND-type flash memory of the first embodiment.

Next, the outline of a write operation using the NAND-type flash memory of this example embodiment is explained by reference to the flow chart of FIG. 7.

Blocks that are to be written (S1) will be erased first, and then the lower pages (LM) write will be carried out. As a result, the threshold distribution of a memory cell to which data "0" is written is elevated, and the intermediate distribution LM is formed (S2). The upper page write is then carried out (S3). The read operation is carried out at the beginning of the write operation using the read voltage VLMu mentioned above, and the number of memory cells in which data "0" can be read is counted by the bit scan circuit 4. In this counting result, the control circuit 6 determines the distribution width of the intermediate distribution LM. (S3-1). After that, based on this determination result, the control circuit 6 determines the magnitude of the verify read voltages $V_{VA}$, $V_{VB}$, and $V_{VC}$ (S3-2). Next, an upper page write is carried out using the determined verify read voltages $V_{VA}$, $V_{VB}$, and $V_{VC}$ (S3-3).

Figure 8:
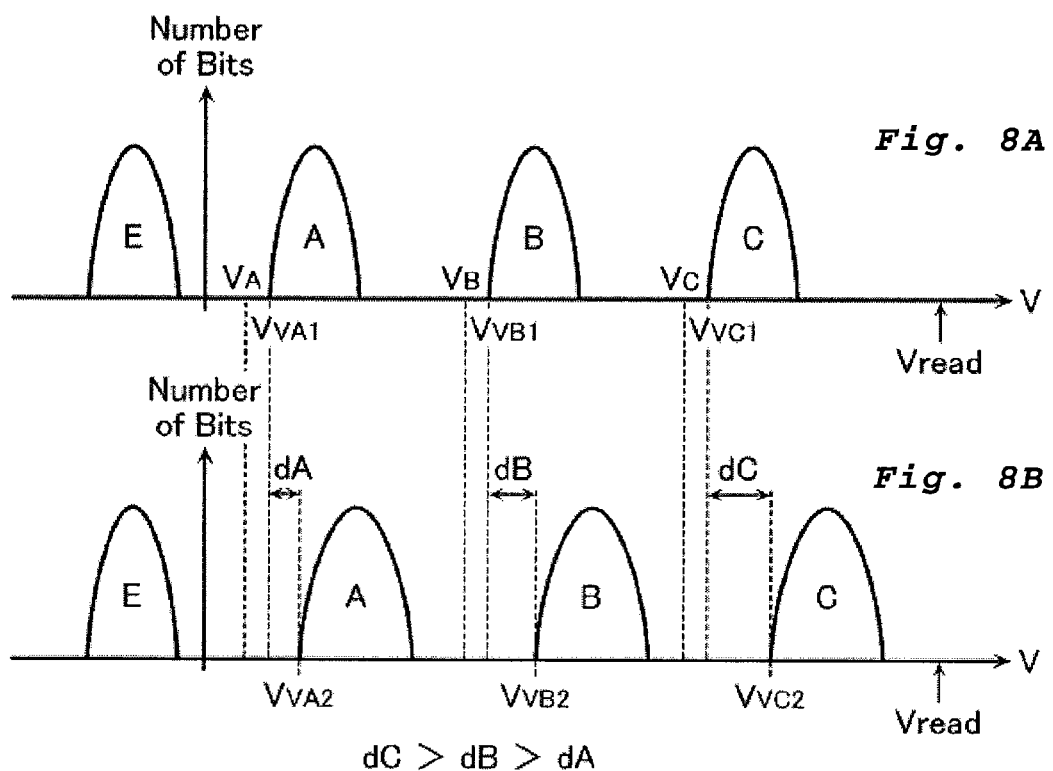
FIGS. 8A and 8B show conceptual diagrams for the explanation of the write operation of NAND-type flash memory of the first embodiment.

FIGS. 8A and 8B explain the action during the write operation using the NAND-type flash memory of this embodiment. For example, just after the shipment of memory, when the lifetime total number of write and erase operations have been few and the distribution width of the intermediate distribution LM is narrow, the verify read voltages $V_{VA}$, $V_{VB}$, and $V_{VC}$ are set to smaller values, $V_{VA1}$, $V_{VB1}$, and $V_{VC1}$, respectively, as shown in the upper part of FIGS. 8A and 8B.

However, as the number of executions of write operation/erase operation increases and the distribution width of the intermediate distribution LM increases due to the deterioration of the gate-insulating film of the memory cell, the verify read voltages $V_{VA}$, $V_{VB}$, and $V_{VC}$ are set to $V_{VA2}$, $V_{VB2}$, and $V_{VC2}$, which are higher than the values $V_{VA1}$, $V_{VB1}$, and $V_{VC1}$, described above, by a magnitude of dA, dB, and dC, respectively. In this embodiment, the read voltages VA, VB, and VC are fixed, regardless of the number of executions of the write operation/erase operation. In this case, the difference between the read voltages VA, VB, and VC and the verify read voltages $V_{VA}$, $V_{VB}$, and $V_{VC}$ increases with the deterioration of the gate-insulating film of the memory cell (based on the increase of the intermediate distribution LM). Therefore, read errors arising from a decline in data retention characteristics can be controlled by adjusting the verify read voltages to higher values.

Here, the adjusted values dA, dB, and dC described above are in the relation of dC>dB>dA, that is the respective verify read voltages have not each been increased by the same amount. Memory cells with threshold voltage distribution C can store more charge in the charge storage film (a floating gate, etc.) than memory cells with lower threshold distributions, and, as a result, variation of threshold voltage occurs more easily in higher distributions. In such cases, it is preferable to set the value of dA, dB, and dC accordingly with a larger increase for higher threshold voltages.

The threshold values of the switch of the verify read voltages can be one or more. There can be several ways to execute plural switches. For example, as shown in FIG. 6A and FIG. 6B, VLMu, which is used for the read of the distribution width of the intermediate distribution LM, can be set to plural values, such as VLMu1 and VLMu2, to determine the width of the intermediate distribution LM more accurately. In addition, as in another example, it is also possible to set plural threshold values of the count value at the bit scan circuit 4. If the threshold value is only one, the verify read voltage values $V_{VA}$, $V_{VB}$, and $V_{VC}$ can be set in two ways.

In this example of this embodiment, in order to make the explanation simple, it has been explained that the read voltages VA, VB, and VC are fixed, regardless of the number of executions of the write operation/erase operation; however, this embodiment is not limited to this case. The fact that the read voltages VA, VB, and VC may vary as a result of many factors is also considered to fall within the scope of an embodiment of this invention. For example, the wider the intermediate distribution LM, the higher the verify read voltages $V_{VA}$, $V_{VB}$, and $V_{VC}$ may be set. Therefore, the difference between the read voltages VA, VB, and VC and the verify read voltages $V_{VA}$, $V_{VB}$, and $V_{VC}$ could be increased with the deterioration of the gate-insulating film of the memory cell (based on the increase of intermediate distribution LM).

Figure 9:
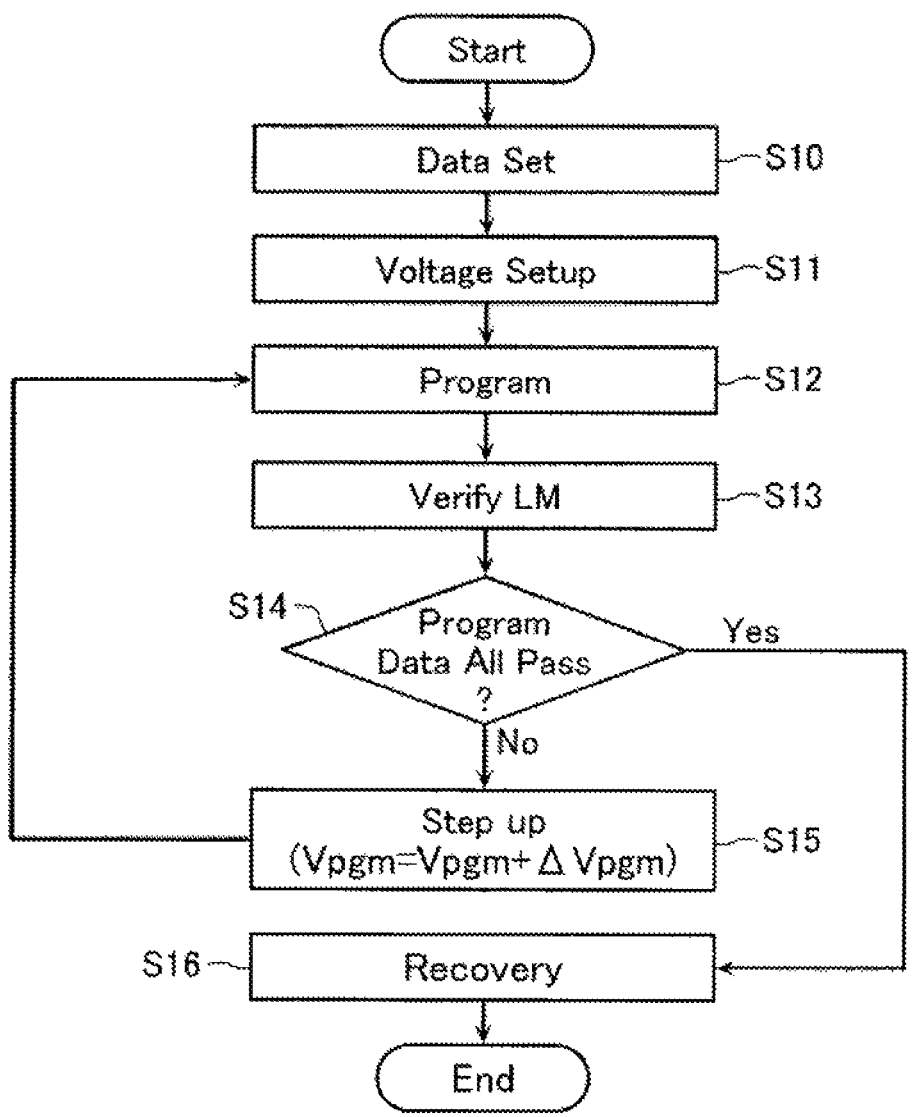
FIG. 9 shows a flowchart for the explanation of the write operation of NAND-type flash memory of the first embodiment.
Figure 10A:
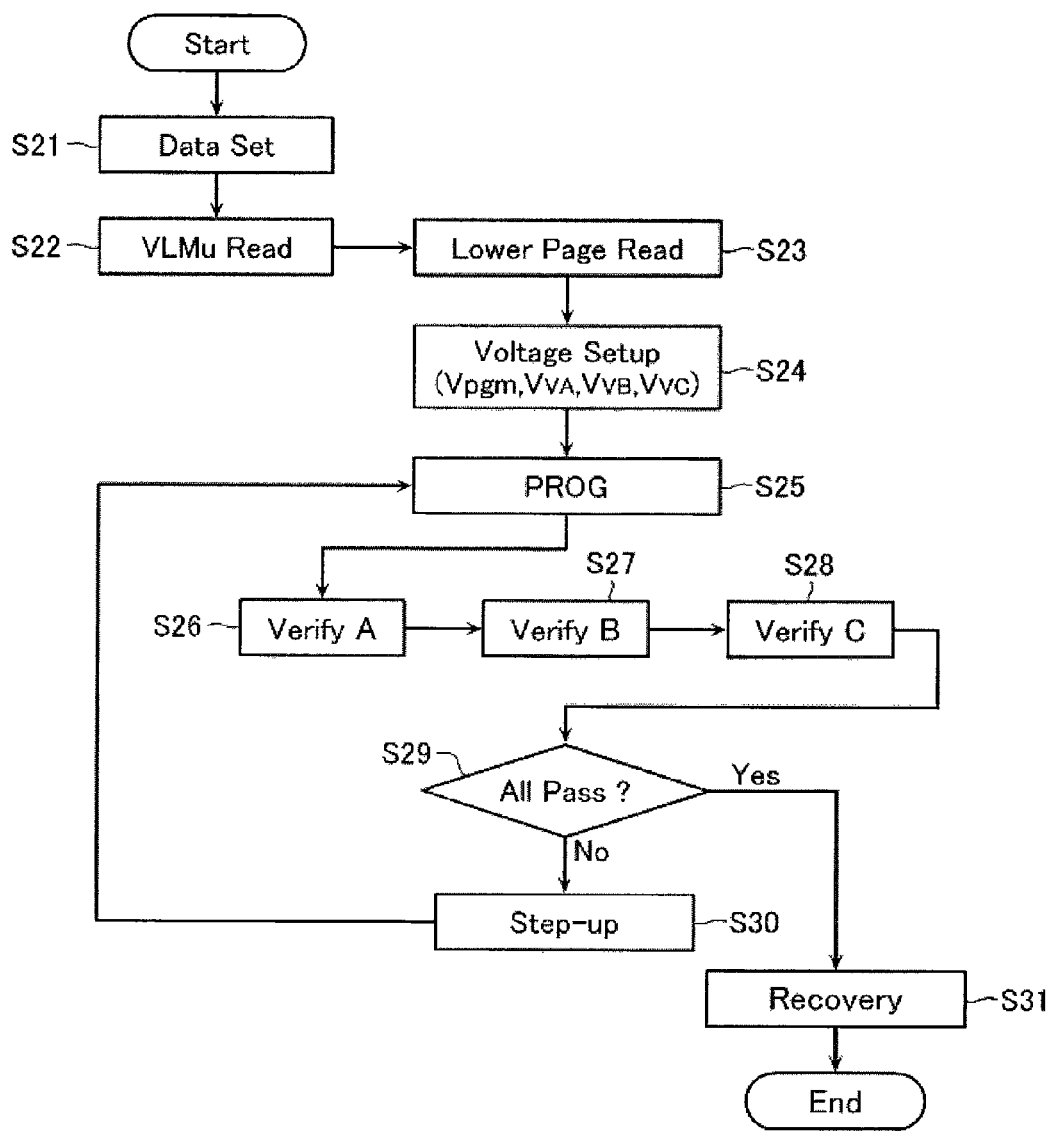
FIG. 10A shows a flow chart for the explanation of the write operation of NAND-type flash memory of the first embodiment.
Figure 10B:
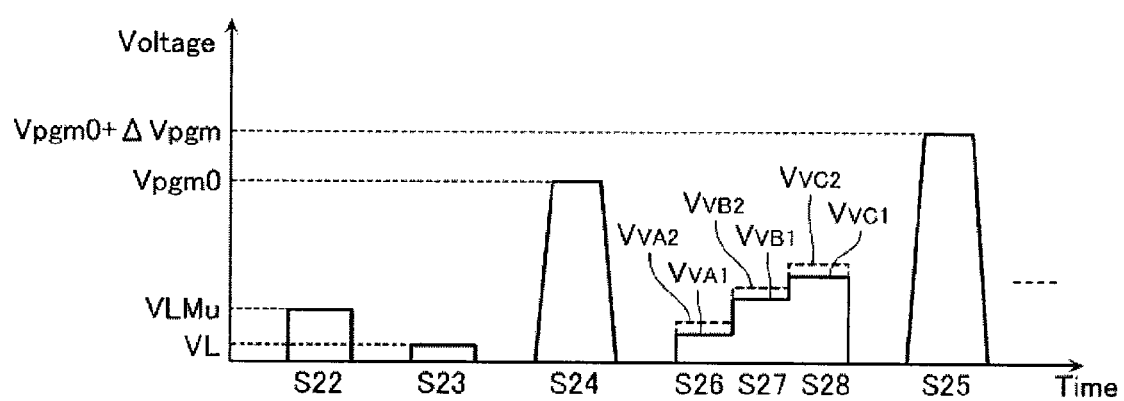
FIG. 10B shows a graph for the explanation of the write operation of NAND-type flash memory of the first embodiment.

The specific procedures of the write operation with regard to the NAND-type flash memory of this embodiment are explained with reference to FIG. 9, FIG. 10A, and FIG. 10B. FIG. 9 shows a flow chart of the specific procedures of a lower page write (step S2 in FIG. 7). FIG. 10A shows a flow chart of the specific procedures of determination of the distribution width of the intermediate distribution LM and an upper page write (step S3 (S3-1 to S3-3) in FIG. 7). FIG. 10B shows the voltage applied to the selected word line when the determination of the distribution width of the intermediate distribution LM and an upper page write is performed.

The specific procedures of lower page write are explained with reference to FIG. 9. First, the command (write command), address, and write data from the external unit HM (a host or memory controller) are input to NAND-type flash memory 21 through I/O buffer 5. Write data is set in data register 2b (data latch DLX) of sense amplifier circuit 2. The address is stored in the address buffer (not shown in the figure) of control circuit 6.

The write start command is input from the external unit HM (a host or memory controller), and then the lower page write starts (Start). The write data set in data latch DLX is transferred to data latch DL1, and the corresponding bit line BL voltage settings are executed (supply voltage Vdd or ground voltage Vss) (S10) based on the data retained in the data latch DL1.

Next, voltage settings necessary for the write operation are performed (S11). In addition, at row decoder 3, the program voltage Vpgm is supplied to select memory cells based on the address data, and the write pass voltage Vpass is supplied to the non-selected memory cell (S11). The program voltage Vpgm and the write pass voltage Vpass are generated by operation of voltage generation circuit 8. In addition, the program voltage Vpgm may be set, for example, to an initial value Vpgm0 at the time of the first write operation. If it is determined by the verify read operation that the write cannot be finished (failure), the program voltage is set to a higher voltage by a step-up value Δ Vpgm by the step-up operation (Vpgm=Vpgm0+ΔVpgm). Similarly, a step-up operation can also be used for the write pass voltage Vpass.

The supply voltage Vdd is supplied to the select gate line SG2 and the ground voltage Vss is supplied to the select gate line SG1. The ground voltage Vss is supplied to the source line CELSRC. The supply voltage Vdd or the ground voltage Vss is supplied to bit lines BL based on the data to be written. In the memory cell where the threshold value is to be changed, the ground voltage Vss is supplied to the channel of the memory cell by conduction of the selected transistor S2 of the drain. On the other hand, in the memory cell where the change of the threshold value is to be prevented, the drain selected transistor S2 is cut off, as a result of which the channel of the memory cell goes into a boost state and the charge injection to the memory cell does not occur.

In this way, the voltage is applied to the word line WL, the bit line BL, the source SL, and the select gate line SG1, SG2, respectively, and the write operation is executed (S12).

Next, the verify read operation is performed to verify that the write operation has been completed (that is, whether it has passed (PASS)) in all memory cells (or over a specified number of memory cells) along the selected word line WL. The verify read operation determines whether the lower limit value of the intermediate distribution LM is higher than the verify read voltage VLM using verify read voltage VLM shown in FIGS. 6A and 6B. If the result indicates that the write operation has not been completed ("No" in S14 of FIG. 9), it moves to step S15 to execute a step-up operation to increase the program voltage Vpgm by the step-up value Δ Vpgm, and then returns to program operation (S12).

On the other hand, if it is determined through the verify read operation that the lower limit of the intermediate distribution LM is higher than the verify read voltage VLM, then the lower page data write of all memory cells (or over a specified number of memory cells) connected to the selected word line has been completed ("Yes" in S14 of FIG. 9), then it moves to S16.

In S16, a recovery operation is executed to set all voltages used in the write operation back to their original values. The lower page write ends through the procedure explained above and the lower page write operation is completed.

Next, the specific procedures of an upper page write are explained with reference to FIG. 10A and FIG. 10B. First, as in the case of a lower page write, the command (write command), address, and write data are input to the NAND-type flash memory 21 from the external unit HM (a host or memory controller) through I/O buffer 5.

The write start command is input from the external unit HM (a host or memory controller) and then the upper page write starts (Start). The write data set by the data latch DLX is transferred to data latch DL1 (S21). Next, a read operation using read voltage VLMu shown in FIG. 6A and FIG. 6B is carried out. And then the distribution width of the intermediate distribution LM is determined based on the outputs of bit scan circuit 4 (S22; see FIG. 10B). Next, a read operation of lower page data already written is executed (S23). Specifically, as shown in FIG. 10B, the read voltage VL between the threshold voltage distribution E and the intermediate distribution LM is applied to the selected word line WL and read pass voltage Vread is applied to the non-selected word line WL to execute the read operation. As a result of this, the lower page data stored in the selected memory cell is read. The lower page data read-out is stored in data latch DLX of data register 3b. In the upper page data write, by the combination of lower page data read-out and upper page data that is to be written, it can be determined which threshold voltage distribution E, A, B or, C should be applied.

The voltage necessary for the write operation is then set (S24), and the write operation starts (S25). In other words, initial values for the program voltage Vpgm and the write pass voltage Vpass are set. In addition, the supply voltage Vdd or the ground voltage Vss is set to the bit line BL based on the write data. In addition, the supply voltage Vdd is set for the selected gate line SG2, and ground voltage Vss is set for the selected gate line SG1.

As the write operation finishes, it moves on to the verify read operation (S26-S28). In other words, three verify read operations using verify read voltages $V_{VA}$, $V_{VB}$, and $V_{VC}$ are executed one after another. The verify read voltages $V_{VA}$, $V_{VB}$, and $V_{VC}$ are determined based on the count result of the bit scan circuit 4, which is based on the read operation S22.

After this verify read operation, if the write operations of all memory cells connected to the selected word line have been completed (PASS) ("Yes" in S29 of FIG. 10A), then a recovery operation (S31) is executed and the upper page write operation ends. Otherwise ("No" in S29 of FIG. 10A), a step-up operation (S30) of the program voltage Vpgm is executed and the write operation (S22) is repeated.

However, in this embodiment it is also possible to use write sequences such as those shown in FIG. 11. For NAND-type flash memory, within the same NAND cell unit, a write is carried out in order from memory cell MC0 of the side close to the common source line CELSRC, with the farthest memory cell M31 being written at the end.

Here, to control the interfering effects of neighboring memory cells, after finishing the lower page write to one memory cell MCi, the lower page write can be executed to the neighboring memory cell MCi+1 instead of going on to perform an upper page write to the same memory cell MCi, as shown in FIG. 11. After that, the write operation can go back to memory cell MCi to perform an upper page write. By executing this write sequence, it is possible to reduce the variation in threshold voltage distribution.

The specific write sequences are explained in reference to the flow charts of FIG. 11 and FIG. 12. After executing a data erase operation to the target block (S31 in FIG. 12), a lower page write (S32) is executed on the memory cells MC0 connected to the word line WL0 closest to the common source line CELSRC. Next, after executing a lower page write (S33) to the memory cells MC1 along the neighboring word line WL1, go back to word line WL0 to perform an upper page write. The read operation is then executed, applying the read voltage VLMu to this word line WL0 to determine the distribution width of the intermediate distribution LM (S34-1). Based on the result, the verify read voltages $V_{VA}$, $V_{VB}$, and $V_{VC}$ are determined (S34-2). The read operation is then executed on the memory cells MC0 along word cable WL0 through the upper page read operation, with the determined verify read voltages $V_{VA}$, $V_{VB}$, and $V_{VC}$ (S34-3).

A lower page write is then performed for word line WL2, separated from word line WL0 in the direction of bit line BL (S35).

Next, an upper page write is performed going back to word line WL1. The read operation is then executed, applying the read voltage VLMu to the word line WL1 to determine the distribution width of the intermediate distribution LM (S36-1), and based on the determination result, the verify read voltages $V_{VA}$, $V_{VB}$, and $V_{VC}$ are determined (S36-2). The write operation (S36-3) is then executed on the memory cells MC1 connected to word line WL1 through an upper page read operation with the determined verify read voltages $V_{VA}$, $V_{VB}$, and $V_{VC}$. Steps S35 to S36 (S36-1 to S36-3) are then repeated until the upper page write of memory cell MC31 is completed.

After executing lower page write (S33) for neighboring word line WL1, the distribution width of the intermediate distribution LM after the shift amount from the lower page write of word line WL1 is reflected can be checked by measured the distribution width of the intermediate distribution LM (S34-1) before executing an upper page write. As a result, it becomes even easier to prevent distribution width of the threshold voltage distributions A, B, and C are wider.

In the first embodiment of the non-volatile semiconductor memory device explained above, the write speed can be increased by changing the value of the verify read voltages $V_{VA}$, $V_{VB}$, and $V_{VC}$, based on the determination results of the distribution width of the intermediate distribution LM.

Moreover, degradation of the data retention characteristics of the memory cell can be determined accurately to measure the distribution width of the intermediate distribution LM for each selected word line. The distribution width of the intermediate distribution LM can be determined accurately by measuring the distribution width of the intermediate distribution LM at the beginning of the upper page write of S3 and not immediately after the lower page write. If the distribution width of the intermediate distribution LM is determined immediately after the completion of the lower page write of word line WL1, there is a possibility that the distribution width of the intermediate distribution LM can be changed by the upper page write to the word line WL0 and the lower page write to the word line WL2. Specifically, the degree of fluctuation will vary depending on the data written to the upper page of the memory cell that is connected to the word line WL0 and the data written to the lower page of the memory cell that is connected to the word line WL2. As a result, it is difficult to control the verify read voltage accurately and appropriately.

On the other hand, in this embodiment, determination of the distribution width of the intermediate distribution LM is done at the beginning of an upper page write to each word line WL (S34-1, S36-1 of FIG. 11). As a result, determination based on the distribution width of the intermediate distribution LM can be done without the effect of the threshold fluctuation caused by adjacent word lines WL. As a result, it is possible to control the verify read voltage based on the determined distribution width of the intermediate distribution LM accurately and appropriately.

Embodiment 2

Figure 13A:
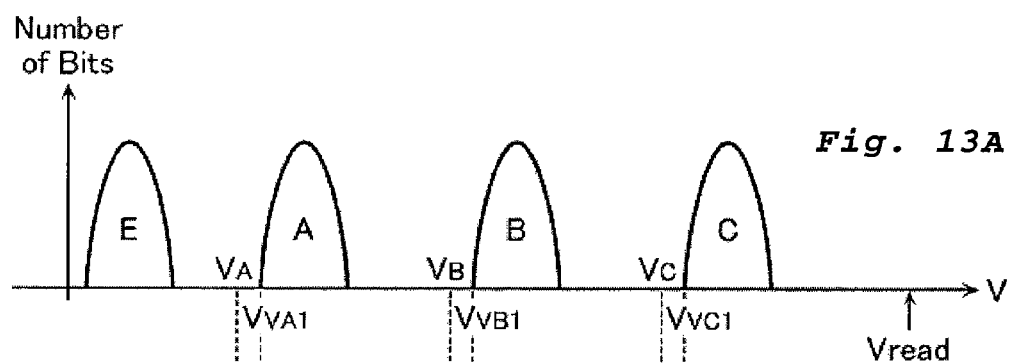
FIGS. 13A and 13B show conceptual diagrams for the explanation of the write operation of NAND-type flash memory of a second embodiment.
Figure 13B:
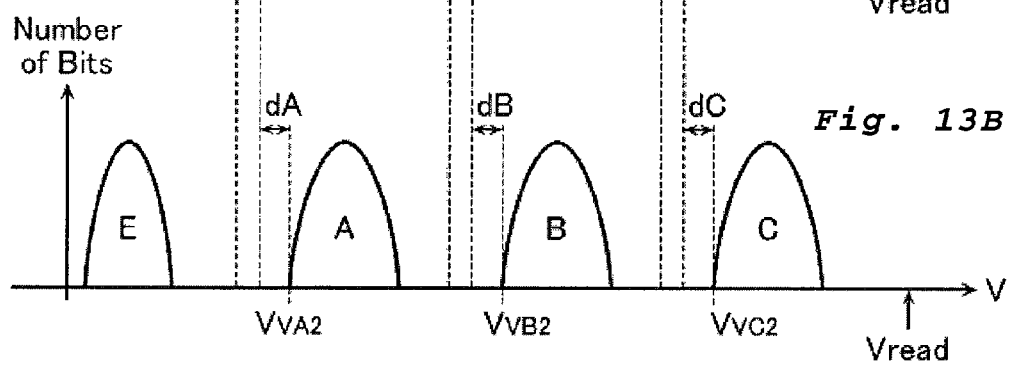

Next, the NAND-type flash memory of a second embodiment is explained in reference to FIGS. 13A and 13B. As the outline structure of the NAND-type flash memory is the same as in the first embodiment, detailed explanation is omitted. The operation is also similar, though the compensating increases in threshold values for distributions A, B, and C (dA, dB, and dC) are set to be the same magnitude (dA=dB=dC) as shown in FIGS. 13A and 13B, rather than varying with increasing threshold voltages (as in FIG. 8B). Setting the compensating increases for distributions A, B, and C to be of equal value is ideal when there is no significant threshold shift of the threshold voltage distribution of A, B, and C. Because there is no need to individually determine dA, dB, and dC, fewer steps are necessary for managing write operations and the NAND-type flash memory 21 operations can be simplified.

Embodiment 3

Figure 14:
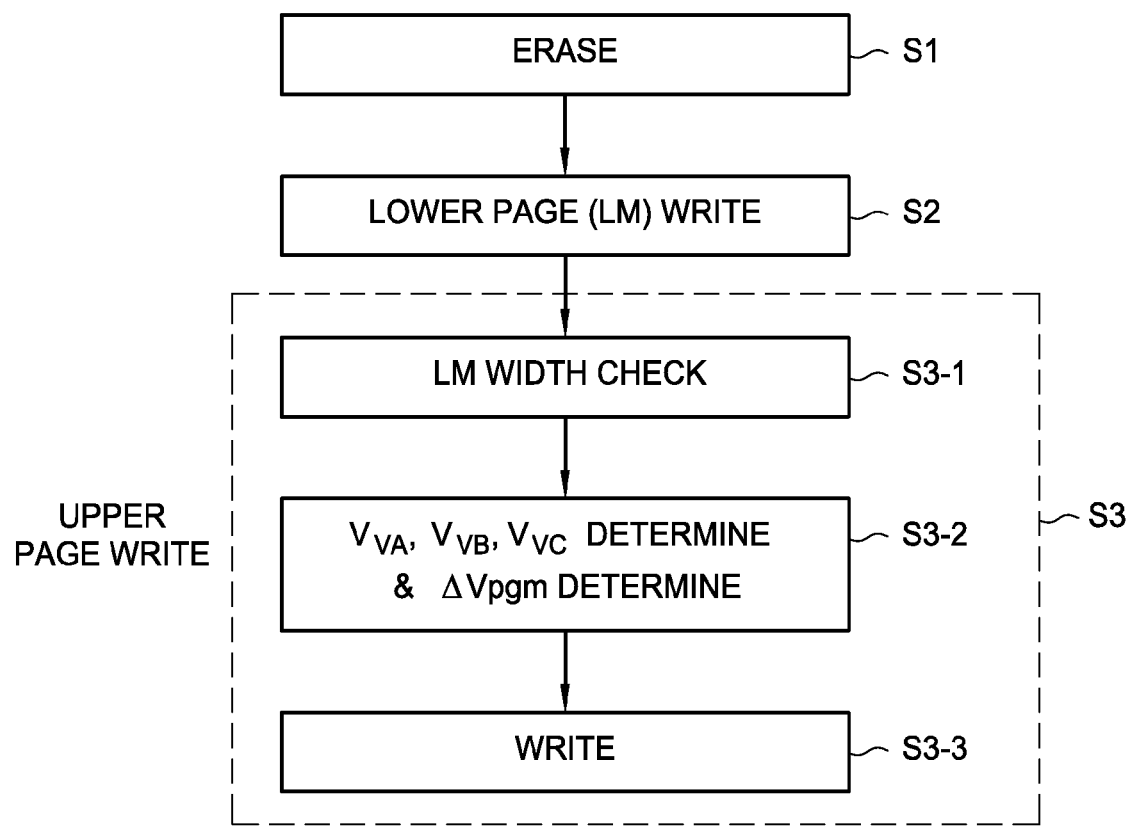
FIG. 14 shows a conceptual diagram for the explanation of the write operation of NAND-type flash memory of a third embodiment.

Next, the NAND-type flash memory of the second embodiment is explained in reference to FIG. 14. The detailed explanation is omitted as the outline structure of the NAND-type flash memory is the same as the first embodiment. However, the operations performed during the write operation differs somewhat from the first embodiment.

FIG. 14 shows the flow chart of the write operation procedure of the third embodiment. The difference from the first embodiment (FIG. 7) is that, not only the verify read voltages $V_{VA}$, $V_{VB}$, and $V_{VC}$ can be changed based on the width of the intermediate distribution, but also the value of the step-up voltage amount $\Delta$ Vpgm may be changed.

If the distribution width of the intermediate distribution LM is large, the deterioration of the gate-insulating film of the memory cell has progressed to a significant extent. When the data retention characteristics of the memory cell have deteriorated, a large step-up voltage amount $\Delta$ Vpgm may be set, but this leads to the increase of the distribution width of the threshold voltage distribution E, A, B, C, which in turn results in the increased misreads. Therefore, if the distribution width of the intermediate distribution LM is large, it is preferable that a small step-up voltage amount $\Delta$ Vpgm be set. By optimizing ΔVpgm to account for the determined width of the intermediate distribution LM it is possible to obtain improved device performance.

Others Possible Embodiments

Several possible embodiments are explained above; these embodiments are given as examples and are not intended to limit the scope of this disclosure. It is possible to execute embodiments of the present invention in various other forms, and there can be omissions, replacements, and changes without deviating from the scope of this disclosure. For example, the voltage value of the verify read pass voltage Vread can also be changed depending on the verify read voltages $V_{VA}$, $V_{VB}$, and $V_{VC}$ of an above embodiment.

In addition, in an above embodiment, the case of adopting a 2 bit/cell memory format is taken as an example and explained, but this disclosure is not limited to that explanation and, for example, can be used for the case where a 3 bit/cell memory format is adopted. In FIGS. 15A to 15D, an example of the write method for executing an 8-value data storage format for the NAND-type flash memory is shown. Such 8-value data is regulated, for instance, by the negative threshold voltage distribution (that is, erasure distribution) eR, which is at the lowest voltage level, and by the threshold voltage distributions A-G, which are set at a higher voltage level than eR.

To write this 8-value data, all the memory cells of the selected block are first set to the lowest negative threshold voltage distribution eR. Next, the operations to obtain the width of the intermediate threshold voltage distribution are performed (LM write (First Stage Program)) using the verify read voltage VLM.

Next, the program operation to obtain intermediate threshold voltage distributions A', B', C', . . . , G' from the intermediate threshold voltage distribution LM, using the verify read voltages $V_{VA}'$, $V_{VB}'$, $V_{VC}'$, . . . , $V_{VG}'$, is performed (Foggy write (Second Stage Program)).

Next, the write operation is executed on the threshold voltage distributions eR, A', B', C', . . . , G' obtained from the Foggy write, and a Fine write operation is performed to obtain the final threshold voltage distributions eR, A to G (Third Stage Program). Moreover, the distribution width, of any of the intermediate threshold voltage distribution A', B', C', . . . , G' immediately after Foggy write operation is determined in the same way as the determination of the distribution width of the intermediate distribution LM previously described. The verify read voltages $V_{VA}$ to $V_{VG}$ determined based on this method can be used for the upper page write.

Figure 16A:
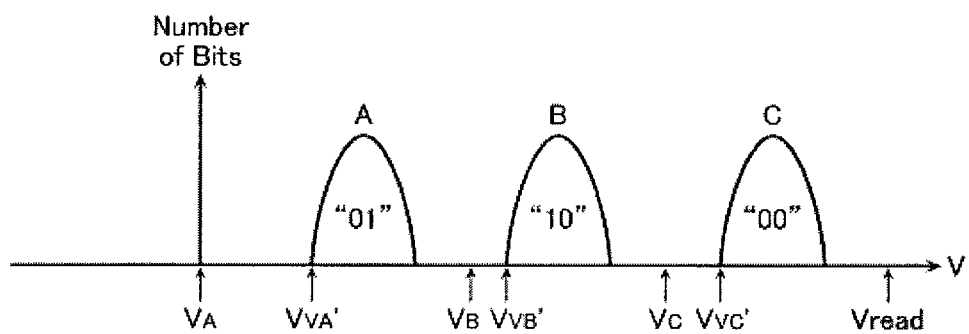
FIGS. 16A and 16B show potential variations for operation of NAND-type flash memory.
Figure 16B:
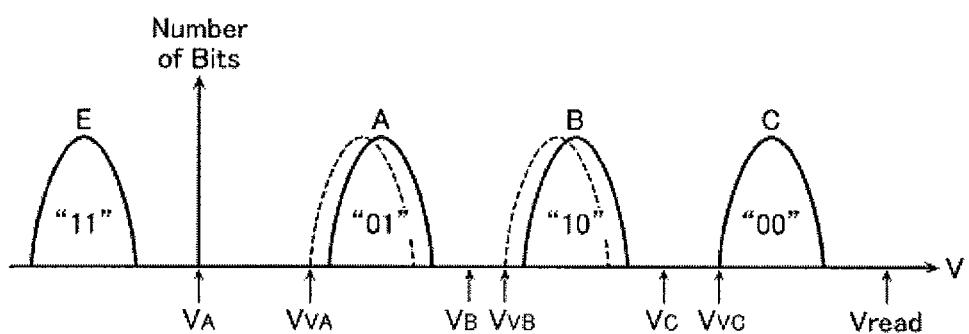

In addition, this embodiment can be applied if a write method that uses the so-called "quick pass write." In the quick pass write, as shown in FIGS. 16A and 16B, a verify read operation (first verify read operation) and write operation are executed by using slightly lower verify read voltages $V_{VA}'$, $V_{VB}'$, and $V_{VC}'$ than used for the verify read operation (second verify read operation) and write operation, which use the verify read voltages $V_{VA}$, $V_{VB}$, and $V_{VC}$. In this case, the distribution width of the threshold voltage distributions A', B', C' obtained from the first verify read operation are measured, and the verify read voltages $V_{VA}$, $V_{VB}$, and $V_{VC}$ can be changed based on the measurement results. As a result, it is possible to improve the write speed by preventing the erroneous data reads from a degradation of the data retention characteristics. In addition, there are cases in which the quick pass write is not used for the highest threshold voltage distribution C of the threshold voltage distribution. This is because the necessity to narrow the width of the threshold voltage distribution is small.

While certain embodiments have been described, these embodiments have been presented by way of example only and are not intended to limit the scope of the embodiments. Indeed, the novel embodiments described herein may be embodied in a variety of other forms; furthermore, various omissions, substitutions, and changes in the form of the embodiments described herein may be made without departing from the spirit of the embodiments. The accompanying claims and their equivalents are intended to cover such forms or modifications as would fall within the scope and spirit of the embodiments.

What is claimed is:

1. A non-volatile semiconductor memory device comprising:
   a memory cell array including a plurality of memory strings, each memory string including a plurality of memory cells connected in series, each memory cell storing multi-valued data;
   a word line that connects to one of the a plurality memory cells;
   a bit line that is connected to a first end of the memory string;
   a source line connected to a second end of the memory string;
   a sense amplifier circuit configured to determine the data to be stored in the memory cell by detecting the potential or the electric current of the bit lines; and
   a control circuit configured to execute a first page writing operation to form an intermediate voltage distribution by changing a threshold voltage of the memory cells connected to the word line,
   a first verify operation to determine if the first page writing operation to the memory cell has been completed by using a first verify voltage,
   a second page writing operation to change the intermediate voltage distribution,
   a second verify operation to determine if the second page writing operation to the memory cell has been completed by using a second verify voltage and a step-up operation that increases the program voltage by a step-up voltage amount based on results of the verify reading,
   wherein the control circuit is configured to execute the first page writing operation which forms the intermediate voltage distribution, and a first read operation which reads data from the intermediate voltage distribution by using a determine voltage higher than the first verify voltage, and to change the second verify voltage based only on the result of the first read operation.

2. The non-volatile semiconductor memory device according to claim 1, wherein the control circuit is configured to change the value of the step-up voltage used in the second page write operation based only on the result of the first read operation.

3. The device of claim 1, further comprising:
   a bit scan circuit wherein the bit scan circuit counts the number of the memory cells which exceed the determine voltage.

4. The device of claim 3 wherein the second verify voltage is changed by the number of the memory cells which exceed the determine voltage in the first read operation.

5. The device of claim 2, further comprising:
   a bit scan circuit wherein the bit scan circuit counts the number of the memory cells which exceed the determine voltage, and the step-up voltage is changed by the number of the memory cells which exceed the determine voltage in the first read operation.

6. The device of claim 4 wherein a change value of the second verify voltage is larger, so that the number of the memory cells counted by the bit scan circuit is large.

7. The device of claim 5 wherein a change value of the step-up voltage is smaller, so that the number of the memory cells counted by the bit scan circuit is large.

8. The device of claim 6 wherein a polarity of threshold distributions is formed in the second page writing operation, and the larger a value of the threshold distributions, the larger the change value of the second verify voltage.

9. The device of claim 1, further comprising:
a sense amplifier circuit connected to the bit line,
the sense amplifier circuit for detecting electrical potential or current to the bit line.

* * * * *